United States Patent
Ping et al.

(10) Patent No.: US 12,419,041 B2
(45) Date of Patent: Sep. 16, 2025

(54) METHOD FOR FORMING STORAGE NODE CONTACT STRUCTURE AND SEMICONDUCTOR STRUCTURE

(71) Applicant: CHANGXIN MEMORY TECHNOLOGIES, INC., Hefei (CN)

(72) Inventors: Erxuan Ping, Hefei (CN); Zhen Zhou, Hefei (CN); Lingguo Zhang, Hefei (CN); Weiping Bai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 608 days.

(21) Appl. No.: 17/543,997

(22) Filed: Dec. 7, 2021

(65) Prior Publication Data
US 2022/0208773 A1 Jun. 30, 2022

Related U.S. Application Data (63) Continuation of application No. PCT/CN2021/109347, filed on Jul. 29, 2021.

(30) Foreign Application Priority Data

Dec. 30, 2020 (CN) .......................... 202011602147.X (51) Int. Cl.
*H10B 12/00* (2023.01)
(52) U.S. Cl.
CPC .................................. *H10B 12/485* (2023.02)
(58) Field of Classification Search
CPC .......................... H10B 12/485; H10B 12/0335; H10B 12/482; G11C 5/063; H01L 21/02532; H01L 21/02595; H01L 21/02598; H01L 21/02609; H01L 21/02639
USPC ........................................................ 257/774
See application file for complete search history.

(56) References Cited

U.S. PATENT DOCUMENTS

| | | | |
|---|---|---|---|
| 5,057,899 A | 10/1991 | Samata | |
| 5,124,276 A | 6/1992 | Samata | |
| 5,637,518 A | 6/1997 | Prall | |
| 6,844,259 B2 | 1/2005 | Cheong | |
| 6,977,204 B1 * | 12/2005 | Joo | .................. H01L 21/28556 438/533 |

(Continued)

FOREIGN PATENT DOCUMENTS

| | | | | |
|---|---|---|---|---|
| CN | 1448992 A | 10/2003 | | |
| CN | 210926003 U * | 7/2020 | ....... | H01L 21/28525 |

(Continued)

*Primary Examiner* — Meiya Li
(74) *Attorney, Agent, or Firm* — SYNCODA LLC; Feng Ma (57) ABSTRACT

Provided is a method for forming a storage node contact structure and a semiconductor structure. The method for forming a storage node contact structure comprises: providing a substrate, bit line structures being formed on a surface of the substrate and contact holes being formed between the bit line structures; and growing silicon crystal in the contact holes and adding a doping source in a growth process, in which a doping concentration of the doping source when the growth is over is greater than a doping concentration when the growth is started so as to form silicon crystal gradual change structures in the contact holes, in which the silicon crystal changes from monocrystalline silicon to heavily doped polycrystalline silicon.

16 Claims, 11 Drawing Sheets

(56) References Cited

U.S. PATENT DOCUMENTS

| | | | |
|---|---|---|---|
| 10,529,560 B2 * | 1/2020 | Miyakura | ......... H01L 21/30604 |
| 2003/0005881 A1 | 1/2003 | Shin | |
| 2003/0186533 A1 | 10/2003 | Cheong | |
| 2008/0153279 A1 | 6/2008 | Hwang | |
| 2018/0350611 A1 * | 12/2018 | Kim | ................... H10B 12/0335 |
| 2021/0050352 A1 * | 2/2021 | Iwaki | ................ H01L 21/32135 |

FOREIGN PATENT DOCUMENTS

| | | |
|---|---|---|
| KR | 20040025967 A | 3/2004 |
| KR | 20080060020 A | 7/2008 |
| KR | 101162258 B1 | 7/2012 |

* cited by examiner

METHOD FOR FORMING STORAGE NODE CONTACT STRUCTURE AND SEMICONDUCTOR STRUCTURE

CROSS-REFERENCE TO RELATED APPLICATIONS

The application is a continuation application of International Patent Application No. PCT/CN2021/109347, filed on Jul. 29, 2021, which claims priority to Chinese Patent Application No. 202011602147.X, filed on Dec. 30, 2020. The disclosures of International Patent Application No. PCT/CN2021/109347 and Chinese Patent Application No. 202011602147.X are hereby incorporated by reference in their entireties.

BACKGROUND

In an array region structure of a current mainstream Dynamic Random Access Memory (DRAM), heavily doped polycrystalline silicon is usually used as a material that is used to connect a storage node to an active area. As a feature size is scalded down continuously, a higher requirement is put forward to resistance of a material of the storage node contact structure due to a smaller bore diameter. Compared with polycrystalline silicon, monocrystalline silicon obtained by epitaxial growth has a huge advantage in material bulk phase resistance and interfacial contact resistance. However, due to problems of low growth rate and difficulty in regulating uniformity and the like, a method for obtaining monocrystalline silicon by epitaxial growth is still hardly applied to a contact structure of a storage node in the array region at present.

SUMMARY

The disclosure relates to the technical field of semiconductor storage node processing technologies, in particular to a method for forming a storage node contact structure and a semiconductor structure.

One aspect of an embodiment of the disclosure provides a method for forming a storage node contact structure. The method includes the following operations. A substrate is provided, in which bit line structures are formed on a surface of the substrate and contact holes are formed between the bit line structures. Silicon crystal is grown in the contact holes by a epitaxial growth process, a doping source is added in a growth process, in which a doping concentration of the doping source when the growth is over is greater than a doping concentration when the growth is started, so as to form silicon crystal gradual change structures in the contact holes, in which the silicon crystal changes from monocrystalline silicon to heavily doped polycrystalline silicon.

Another aspect of the embodiment of the disclosure provides a semiconductor structure. The semiconductor structure includes a substrate, in which bit line structures formed on a surface of the substrate and contact holes formed between the bit line structures, and silicon crystal gradual change structures formed in the contact holes, in which the silicon crystal changes from monocrystalline silicon to heavily doped polycrystalline silicon.

DETAILED DESCRIPTION

The exemplary embodiment will be described more comprehensively with reference to drawings. However, the exemplary embodiment can be implemented in various forms and shall not be construed as limitation to the embodiment described herein. On the contrary, the embodiments are provided to make the disclosure comprehensive and integral and the concept of the exemplary embodiment is comprehensively transferred to those skilled in the art. Same reference numerals in the drawings represent same or similar structures, and thus, detailed description thereof will be omitted.

The First Embodiment of a Method for Forming a Storage Node Contact Structure Referring to FIG. 1 to FIG. 4, they representatively illustrate structural schematic diagrams of semiconductor structures in operations of a method for forming a storage node contact structure provided by the disclosure respectively. In this exemplary embodiment, the method for forming a storage node contact structure provided by the disclosure is described by taking application to a storage node of the DRAM apparatus as an example. Those skilled in the art easily understand that various modifications, additions, substitutions, deletions or other variations to the specific embodiments described below for the purpose of applying the related design of the disclosure to other types of the semiconductor structures or other processes still fall within the scope of the principle of the method for forming the storage node contact structure provided by the disclosure.

In the embodiment, the method for forming a storage node contact structure provided by the disclosure includes the following operations.

A substrate 100 is provided, in which bit line structures 200 are formed on a surface of the substrate 100 and contact holes 300 are formed between the bit line structures.

Silicon crystal 400 is grown in the contact holes 300 by adopting an epitaxial growth process, a doping source is added in a growth process of the silicon crystal, in which a doping concentration of the doping source when the growth is over is greater than a doping concentration when the growth is started so as to form silicon crystal 400 gradual change structures in the contact holes 300, in which the silicon crystal changes from monocrystalline silicon to heavily doped polycrystalline silicon.

By means of the above design, the disclosure may improve the processing efficiency of the contact and lower the production cost while reducing the resistance of the storage node contact structure.

Based on exemplary description of a design concept of the method for forming a storage node contact structure provided by the disclosure, the structural states of the semiconductor structure in each operation in this embodiment is described below in combination of FIG. 1 to FIG. 4.

Figure 1:
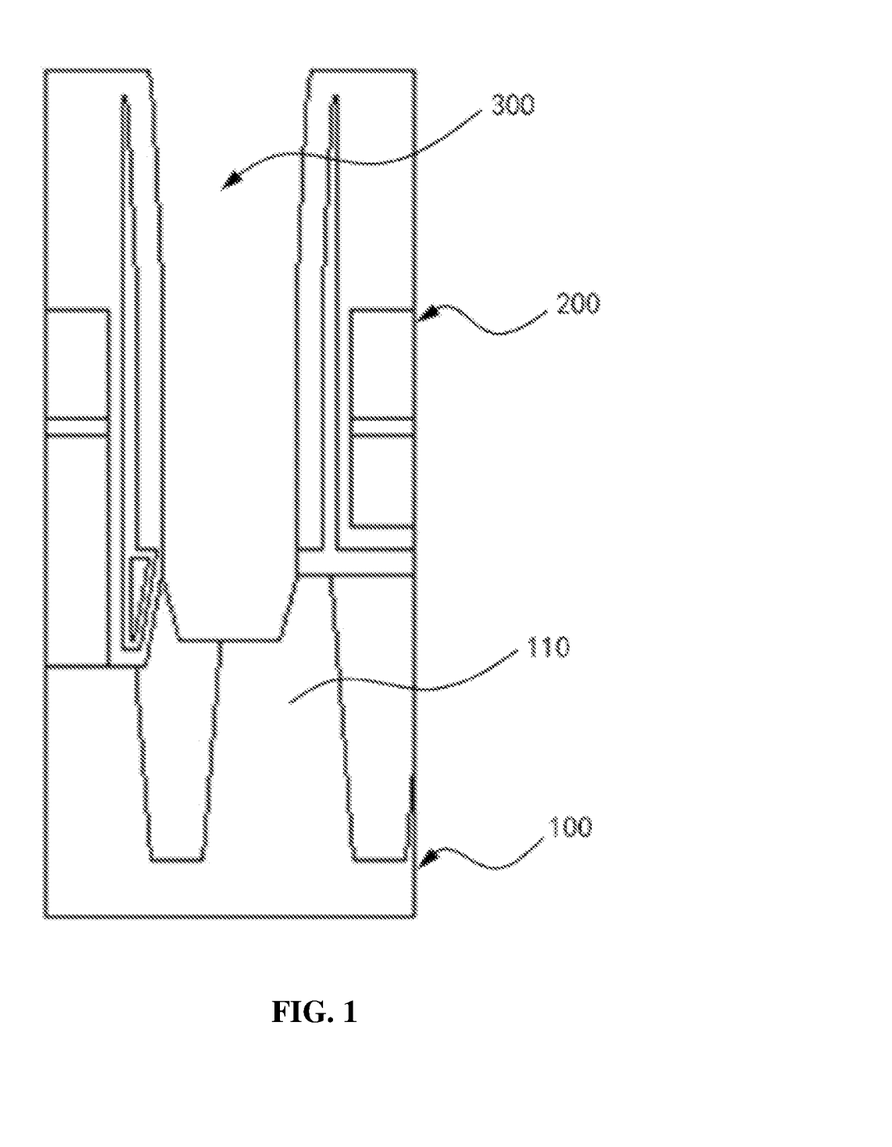
FIG. 1 to FIG. 4 are structural schematic diagrams of semiconductor structures in operations of a method for forming a storage node contact structure according to an exemplary embodiment.

As shown in FIG. 1, it representatively illustrates the structural schematic diagram of the semiconductor structure in the operation of providing the substrate 100. In the operation, the semiconductor includes a substrate 100, bit line structures 200 and contact holes 300. Specifically, active areas 110 are formed in the substrate 100, the bit line structures 200 are formed on a surface of the substrate 100 and the contact holes 300 are formed between every adjacent two bit line structures 200.

Figure 2:
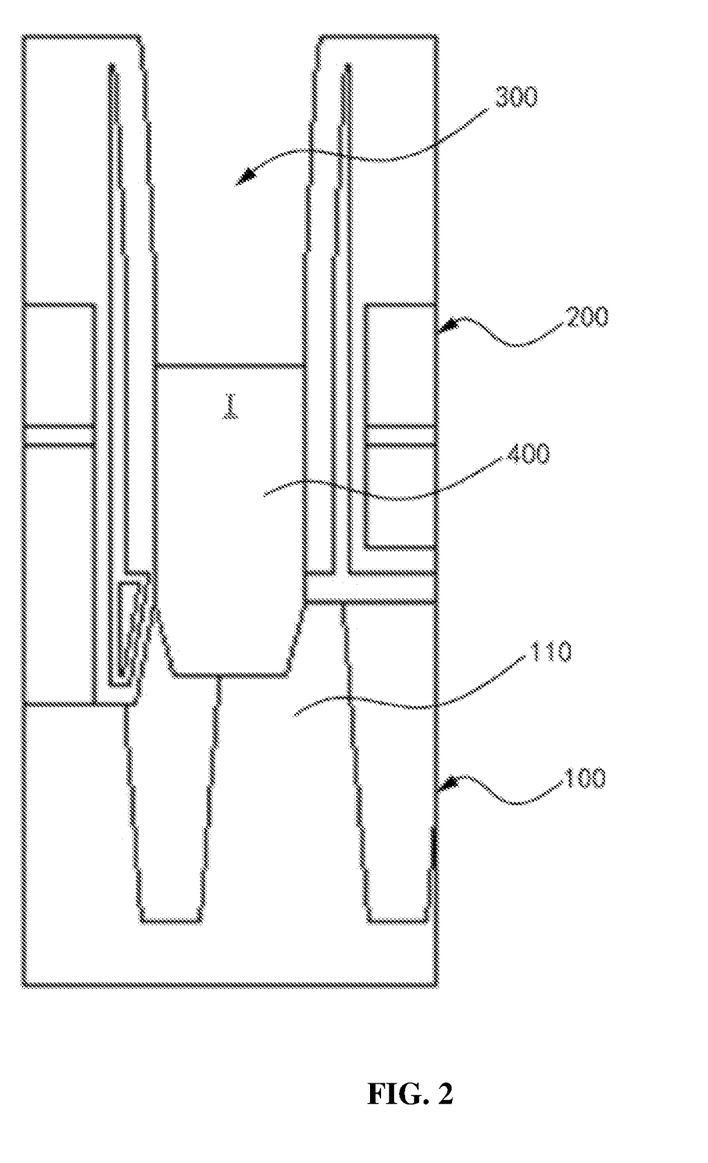
Figure 3:
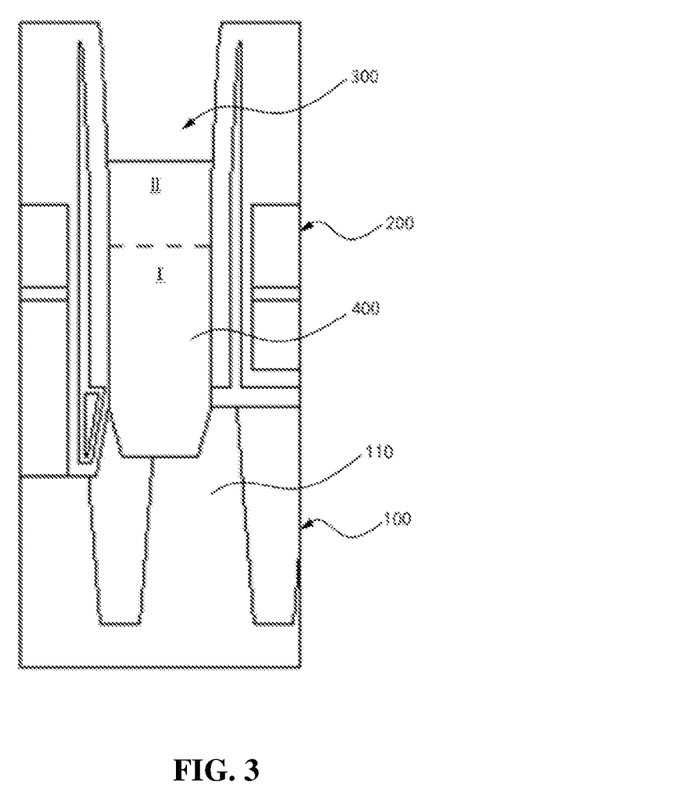
Figure 4:
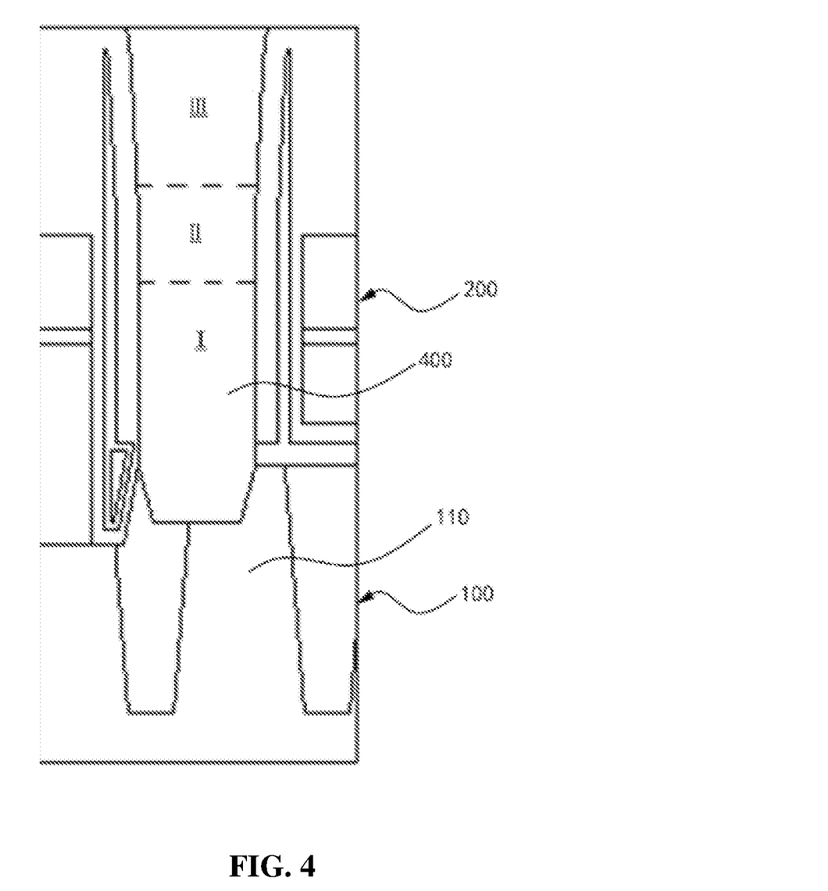

Optionally, as shown in FIG. 2 to FIG. 4, in the embodiment, the growth process of the silicon crystal 400 may include a plurality of growth stages. On this basis, the doping concentration of the doping source may be increased gradually in these growth stages. So called "increased gradually" may be understood that regardless of whether the doping concentration of the doping source in any growth stage is a constant value or a changed value, the minimum value of the doping concentration of the doping source in one growth stage is greater than or equal to the maximum value of the doping concentration of the doping source in the previous growth stage and is smaller than or equal to the minimum value of the doping concentration of the doping source in the next growth stage. In other embodiments, the growth process of the silicon crystal 400 may be one growth stage, and the doping concentration of the doping source in the growth stage may be increased gradually.

Further, as shown in FIG. 2 to FIG. 4, on the basis of a process design that the growth process of the silicon crystal 400 includes a plurality of growth stages, in this embodiment, the doping concentration of the doping source in any one of the growth stages may be constant. On this basis, the doping concentration of the doping source in any growth stage is greater than the doping concentration thereof in the previous growth stage and is smaller than the doping concentration thereof in the next growth stage.

It is to be noted that in other embodiments, regardless of whether the growth process of the silicon crystal 400 includes the plurality of growth stages or not, the doping concentration of the doping source in the growth process may be of a gradual increase design. That is, in the growth process of the silicon crystal 400, the doping concentration of doping source at any moment is greater than the doping concentration of doping source at the previous moment, which is not limited by the embodiment.

Further, as shown in FIG. 2 to FIG. 4, on the basis of the process design that the doping concentration of the doping source in each growth stage of the silicon crystal 400 is constant, in this embodiment, the growth process of the silicon crystal 400 sequentially includes a first growth stage, a second growth stage and a third growth stage, the doping concentration of the doping source in the first growth stage is constant and is a first concentration, the doping concentration of the doping source in the second growth stage is constant and is a second concentration, and the doping concentration of the doping source in the third growth stage is constant and is a third concentration. On this basis, the first concentration is smaller than the second concentration, and the second concentration is smaller than the third concentration.

As shown in FIG. 2, it representatively illustrates the structural schematic diagram of the semiconductor structure in the "first growth stage of the silicon crystal 400". In the operation, the semiconductor structure includes a substrate 100, bit line structures 200, contact holes 300 and first regions I where the silicon crystal 400 grows in the first growth stage. Specifically, the silicon crystal 400 in the first region I grows in a contact hole 300 and grows upwards from the bottom of the contact hole 300. In the first growth stage, the doping source may be closed in the beginning to promote formation of a non-doping monocrystalline epitaxial growth layer, such that the stability of monocrystalline epitaxial growth is ensured. Then, the doping source may be opened and the doping concentration of the doping source may be controlled to be constant and to be the first concentration to form the doped monocrystalline silicon. The doping concentration of the interfacial monocrystalline silicon is improved by diffusing the doping source, and thus the first region I with low resistance (including bulk phase resistance and interfacial resistance) is obtained.

Further, as far as the first growth stage of the silicon crystal 400 is concerned, by taking the doping source including phosphorus (P) as an example, the first concentration may be a constant value of $7E+20/cm^3 \sim 8E+20/cm^3$, for example, $7E+20/cm^3$, $7.5E+20/cm^3$, $8E+20/cm^3$ and etc. In other embodiments, the first concentration of the doping source in the first growth stage may be smaller than $7E+20/cm^3$ or may be greater than $8E+20/cm^3$, for example, $6.9E+20/cm^3$, $8.2E+20/cm^3$ and etc., which is not limited by the embodiment.

As shown in FIG. 3, it representatively illustrates the structural schematic diagram of the semiconductor structure in the "second growth stage of the silicon crystal 400". In the operation, the semiconductor structure includes a substrate 100, bit line structures 200, contact holes 300 and first regions I where the silicon crystal 400 grows in the first growth stage and second regions II where the silicon crystal 400 grows in the second growth stage. Specifically, the silicon crystal 400 in the second region II grows in the contact hole 300 and grows upwards from the top of the first region I.

Further, as far as the second growth stage of the silicon crystal 400 is concerned, by taking the doping source including phosphorus as an example, the second concentration may be a constant value of $8.5E+20/cm^3 \sim 9.5E+20/cm^3$, for example, $8.5E+20/cm^3$, $9E+20/cm^3$, $9.5E+20/cm^3$ and etc. In other embodiments, the second concentration of the doping source in the second growth stage may be smaller than $8.5E+20/cm^3$ or may be greater than $9.5E+20/cm^3$, for example, $8.4E+20/cm^3$, $9.7E+20/cm^3$ and etc., which is not limited by the embodiment.

As shown in FIG. 4, it representatively illustrates the structural schematic diagram of the semiconductor structure in the "third growth stage of the silicon crystal 400". In the operation, the semiconductor structure includes a substrate 100, bit line structures 200, contact holes 300, and first regions I where the silicon crystal 400 grows in the first growth stage, second regions II where the silicon crystal 400 grows in the second growth stage and third regions III where the silicon crystal 400 grows in the third growth stage. Specifically, the silicon crystal 400 in the third region II grows in the contact hole 300 and grows upwards from the top of the second region II. In the third growth stage, as the doping concentration of the doping source is increased, the silicon crystal 400 forms the heavily doped polycrystalline silicon gradually in the third region III, thereby improving the growth rate and the growth homogeneity.

Further, as far as the third growth stage of the silicon crystal 400 is concerned, by taking the doping source including phosphorus as an example, the third concentration may be a constant value of $1E+21/cm^3 \sim 1.1E+21/cm^3$, for example, $1E+21/cm^3$, $1.05E+21/cm^3$, $1.1E+21/cm^3$ and etc. In other embodiments, the third concentration of the doping source in the third growth stage may be smaller than $1E+21/cm^3$ or may be greater than $1.1E+21/cm^3$, for example, $0.99E+21/cm^3$, $1.12E+21/cm^3$ and etc., which is not limited by the embodiment.

Further, on the basis of a process design that the growth process of the silicon crystal 400 includes three growth stages, by taking the doping source including phosphorus (P) as an example, the first concentration may be $7.5E+20/cm^3$, the second concentration may be $9E+20/cm^3$ and the third concentration may be $1.05E+21/cm^3$.

The Second Embodiment of Method for Forming a Storage Node Contact Structure

Based on the above detailed description of a method for forming a storage node contact structure in an exemplary embodiment provided by the disclosure, a method for forming a storage node contact structure in another exemplary embodiment provided by the disclosure is described in combination with FIG. 6 to FIG. 9.

Referring to FIG. 6 to FIG. 9, they representatively illustrate structural schematic diagrams of semiconductor structures in operations of a method for forming a storage node contact structure provided by the disclosure respectively. The method for forming a storage node contact structure provided by the disclosure in this exemplary embodiment is substantially same as that in the first embodiment in the process design. Primary difference between this embodiment and the first embodiment is described below.

As shown in FIG. 6 to FIG. 9, in this embodiment, before the silicon crystal 400 grows, a groove 111 is formed in a portion at a bottom of the contact hole 300 corresponding to an active area 110, and an included angle α that is greater than 0 degree but smaller than 90 degrees is between an axial direction of an opening of the groove 111 and a vertical direction. On this basis, the silicon crystal 400 grows starting from the groove 111 by epitaxial growth process. the growth rates of the silicon crystal 400 along a first direction X and a second direction Y are controlled in the growth process, such that the growth rate of the silicon crystal 400 along the first direction X is greater than the growth rate of the silicon crystal 400 along the second direction Y when the growth is started; and the growth rate of the silicon crystal 400 along the first direction X is equal to the growth rate of the silicon crystal 400 along the second direction Y when the growth is over. Thus, gaps 410 are respectively formed between the silicon crystal 400 and two side walls of the bit line structures at the two sides of the silicon crystal along the second direction Y. The first direction X is the axial direction of the opening of the groove 111 and the second direction Y is perpendicular to the first direction X in a vertical plane. By means of the above design, the disclosure may reduce parasitic capacitance between the storage node contact structure and the bit line structure while reducing the resistance of the storage node contact structure.

Figure 6:
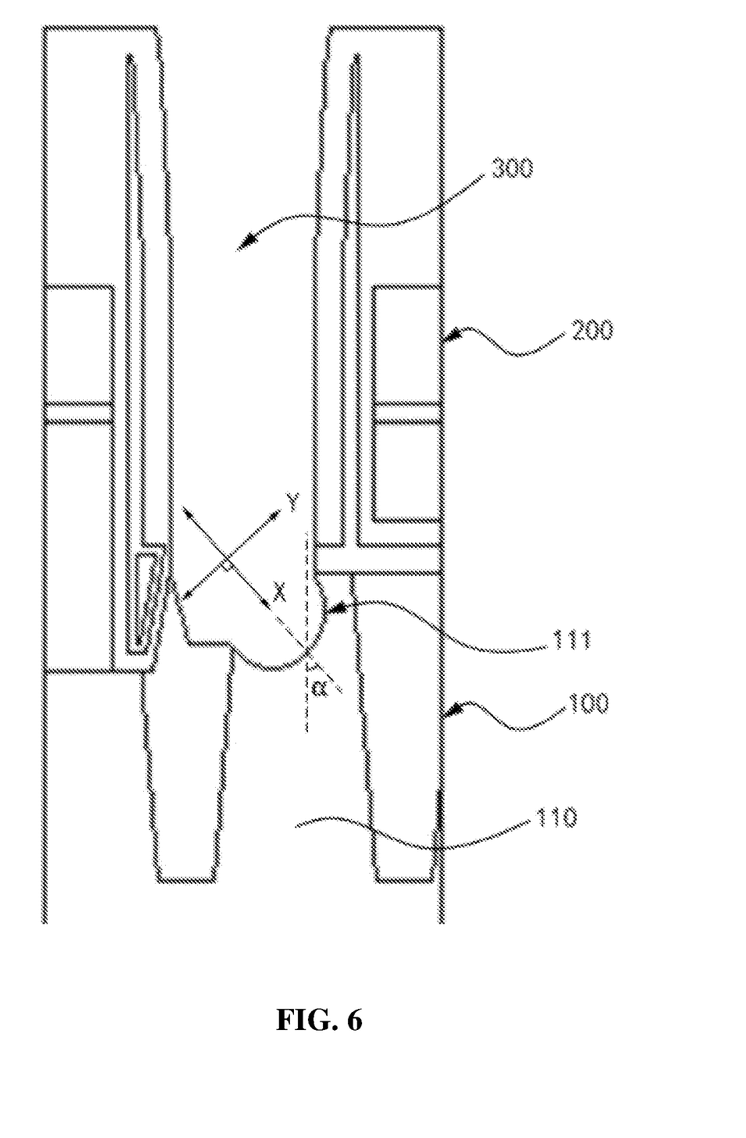
FIG. 6 to FIG. 9 are structural schematic diagrams of semiconductor structures in operations of a method for forming a storage node contact structure according to another exemplary embodiment.

As shown in FIG. 6, it representatively illustrates the structural schematic diagram of the semiconductor structure in the operation of forming the groove 111. In the operation, the semiconductor structure includes a substrate 100, bit line structures 200 and contact holes 300. Specifically, an active areas 110 are formed in the substrate 100, the bit line structures 200 are formed on a surface of the substrate 100, the contact holes 300 are formed between every adjacent two bit line structures 200, and the groove 111 is formed at a portion of the bottom of each of the contact holes 300 corresponding to the active area 110.

Optionally, in the embodiment, in the growth process of the silicon crystal 400, the growth rates of the silicon crystal along the first direction X and the second direction Y are controlled by adding an inhibitor and controlling the amount of the inhibitor, in which an added amount of the inhibitor is negatively related to an epitaxial growth nucleation rate of the silicon crystal 400. On this basis, the added amount of the inhibitor when the growth is over is smaller than the added amount when the growth is started.

Figure 7:
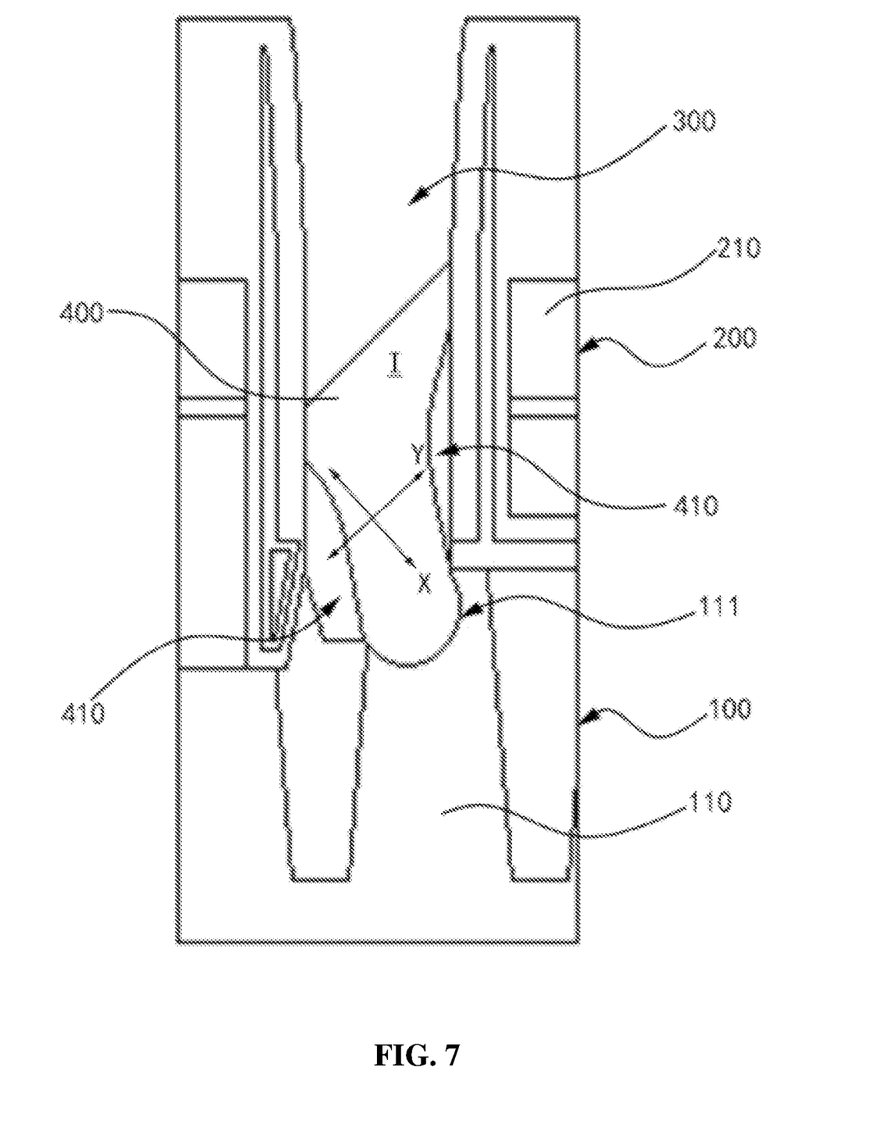
Figure 8:
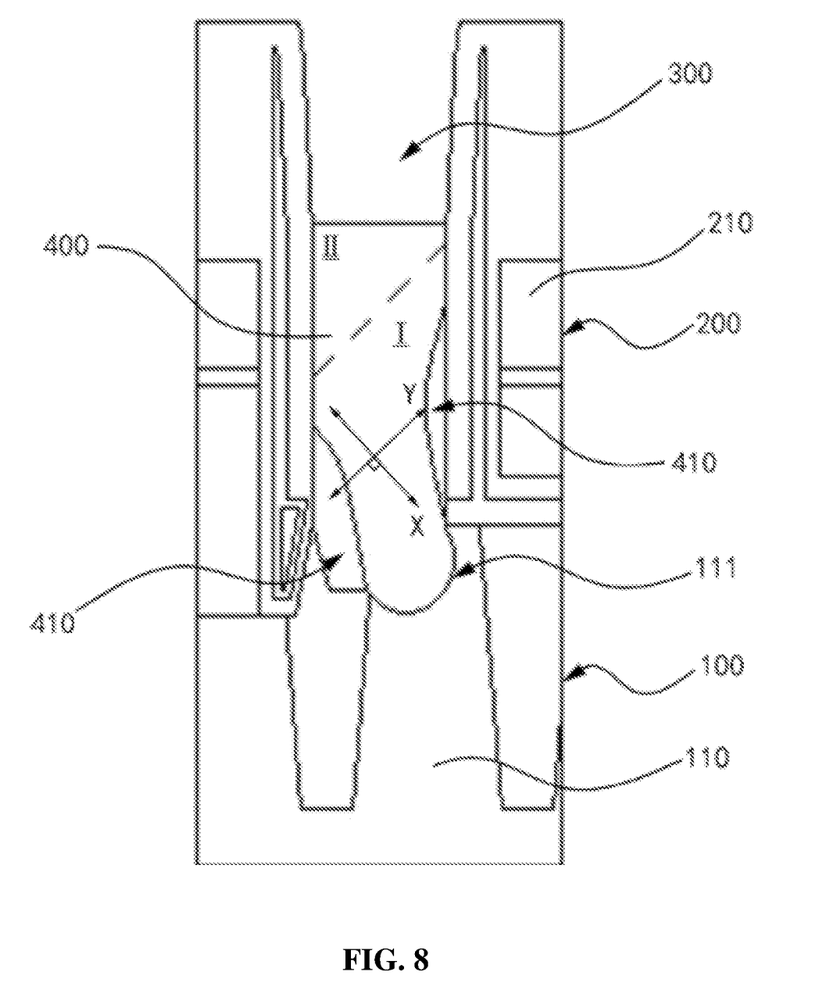
Figure 9:
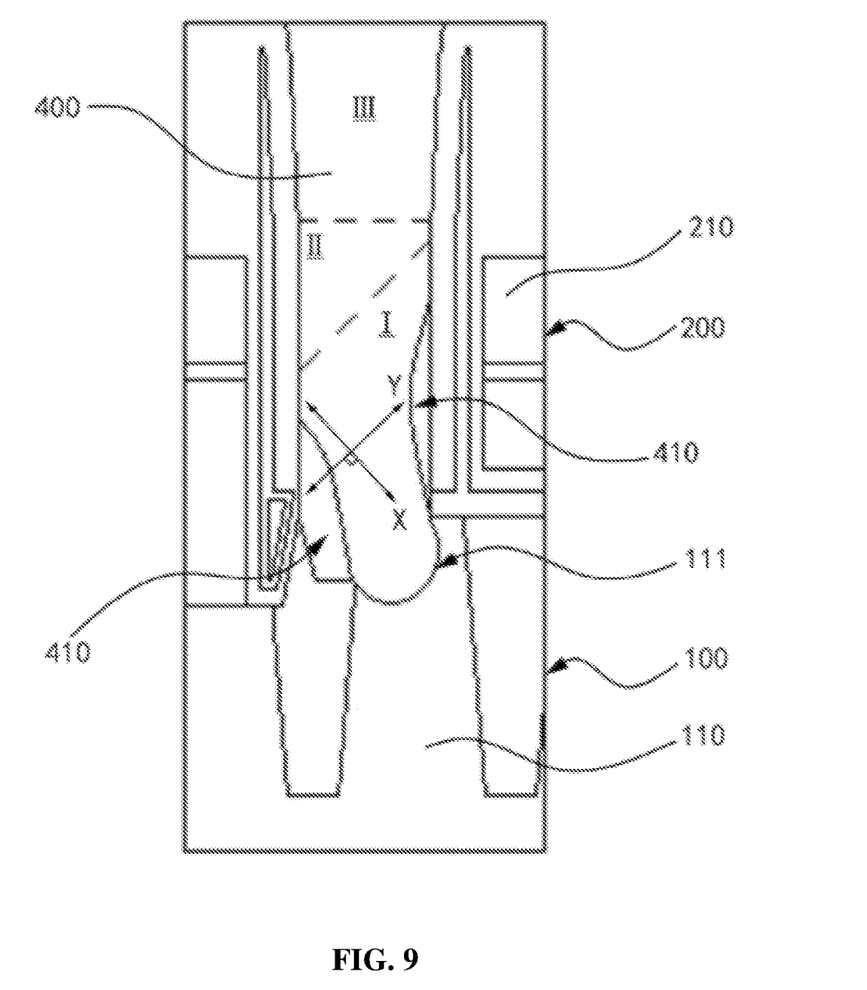

Optionally, as shown in FIG. 7 to FIG. 9, in this embodiment, the growth process of the silicon crystal 400 may include a plurality of growth stages. On this basis, the added amount of the inhibitor may be decreased gradually in these growth stages. So called "decreased gradually" may be understood that regardless of whether the added amount of the inhibitor in any growth stage is a constant value or a changed value, the minimum value of the added amount of the inhibitor in one growth stage is greater than or equal to the maximum value of the added amount thereof in the previous growth stage and is smaller than or equal to the minimum value of the added amount thereof in the next growth stage. In other embodiments, the growth process of the silicon crystal 400 may be one growth stage in which the added amount of the inhibitor may be decreased gradually.

Further, in this embodiment, in the growth process of the silicon crystal 400, the added amount of the inhibitor when growth is over may be 0 or may not be 0. In other words, in the growth process of the silicon crystal 400, the added amount of the inhibitor may be gradually decreased from an added amount at the beginning of growth to 0 or another amount.

Further, as shown in FIG. 7 to FIG. 9, based on the process design that the growth process of the silicon crystal 400 includes the plurality of growth stages, in this embodiment, the growth process of the silicon crystal 400 sequentially includes the first growth stage, the second growth stage and the third growth stage. The added amount of the inhibitor in the first growth stage is constant and is a first amount, the added amount of the inhibitor in the second growth stage is an amount range decreased gradually, and the added amount of the inhibitor in the third growth stage is constant and is a third amount. The first amount is greater than or equal to an upper limit of the amount range, and a lower limit of the amount range is greater than or equal to the third amount. In other embodiments, the inhibitor in the first growth stage or the second growth stage may be in an amount range with gradually decreased amount, which is not limited by the embodiment.

As shown in FIG. 7, it representatively illustrates the structural schematic diagram of the semiconductor structure in the "first growth stage of the silicon crystal 400". In this operation, the semiconductor structure includes a substrate 100, bit line structures 200, contact holes 300 and first regions I where the silicon crystal 400 grows in the first growth stage. Specifically, the silicon crystal 400 in the first region I grows in the contact hole 300 and grows upwards from the groove 111. In the growth process of the silicon crystal 400 in the first region I, as a high amount of the inhibitor is added, the growth rate of the silicon crystal 400 along the first direction X is greater than the growth rate thereof along the second direction Y, such that gaps 410 are respectively formed between the silicon crystal 400 and the bit line structures 200 on two sides along the first direction X.

Further, as far as the first growth stage of the silicon crystal 400 is concerned, by taking the inhibitor including hydrochloric acid (HCl) as an example and representing the added amount of the inhibitor with the flow rate of the hydrochloric acid, the first flow rate (that is, the first amount) may be a constant value of 175 sccm~185 sccm, for example, 175 sccm, 180 sccm, 185 sccm and etc. In other embodiments, the first flow rate of the hydrochloric acid in the first growth stage may be smaller than 175 sccm or may be greater than 185 sccm, for example, 174 sccm, 187 sccm and etc., which is not limited by the embodiment.

As shown in FIG. 8, it representatively illustrates the structural schematic diagram of the semiconductor structure in the "second growth stage of the silicon crystal 400". In this operation, the semiconductor structure includes a substrate 100, bit line structures 200, contact holes 300 and first regions I where the silicon crystal 400 grows in the first growth stage and second regions II where the silicon crystal 400 grows in the second growth stage. Specifically, the silicon crystal 400 in the second region II grows in the contact hole 300 and grows upwards from the top of the first region I. In the growth process of the silicon crystal 400 in the second region II, as the added amount of the inhibitor is decreased gradually, the growth rate of the silicon crystal 400 along the first direction X approaches to be equal to the growth rate thereof along the second direction Y.

Further, as far as the second growth stage of the silicon crystal 400 is concerned, by taking the inhibitor including hydrochloric acid as an example and representing the added amount of the inhibitor with the flow rate of the hydrochloric acid, the upper limit of the flow rate range (that is, amount range) may be 130 sccm~140 sccm, for example, 130 sccm, 135 sccm, 140 sccm and etc., and furthermore, the lower limit of the flow rate range may be 85 sccm~95 sccm, for example, 85 sccm, 90 sccm, 95 sccm and etc. In other embodiments, the upper limit of the flow rate range of the hydrochloric acid in the second growth stage may be smaller than 130 sccm or may be greater than 140 sccm, for example, 129 sccm, 142 sccm and etc., and the lower limit of the flow rate range of the hydrochloric acid in the second growth stage may be smaller than 85 sccm or may be greater than 95 sccm, for example, 84 sccm, 97 sccm and etc., which is not limited by the embodiment.

As shown in FIG. 9, it representatively illustrates the structural schematic diagram of the semiconductor structure in the "third growth stage of the silicon crystal 400". In this operation, the semiconductor structure includes a substrate 100, bit line structures 200, contact holes 300 and first regions I where the silicon crystal 400 grows in the first growth stage, second regions II where the silicon crystal 400 grows in the second growth stage and third regions III where the silicon crystals 400 grow in the third growth stage III. Specifically, the silicon crystal 400 in the third region III grows in the contact hole 300 and grows upwards from the top of the second region II. In the growth process of the silicon crystal 400 in the third region III, as a low amount of the inhibitor is added, the growth rate of the silicon crystal 400 along the first direction X is equal to the growth rate thereof along the second direction Y.

Further, as far as the third growth stage of the silicon crystal 400 is concerned, by taking the inhibitor including hydrochloric acid as an example and representing the added amount of the inhibitor with the flow rate of the hydrochloric acid, the third flow rate (that is, the third amount) may be a constant value of 40 sccm~50 sccm, for example, 40 sccm, 45 sccm, 50 sccm and etc. In other embodiments, the third flow rate of the hydrochloric acid in the third growth stage may be smaller than 40 sccm or may be greater than 50 sccm, for example, 38 sccm, 51 sccm and etc., which is not limited by the embodiment. In other embodiments, the flow rate of the hydrochloric acid in the third growth stage may be a gradually decreased flow rate range or may be a flow rate range gradually decreased to 0 or may be 0.

Further, by taking the inhibitor including hydrochloric acid as an example and representing the added amount of the inhibitor with the flow rate of the hydrochloric acid, the first flow rate (that is, the first amount) may be 180 sccm, the flow rate range (that is, the amount range) of hydrochloric acid may be 90 sccm~135 sccm, and the third flow rate (that is, the third amount) of hydrochloric acid may be 45 sccm.

Optionally, as shown in FIG. 6 to FIG. 9, in this embodiment, the included angle α between the axial direction (that is, the first direction X) of the opening of the groove 111 and the vertical direction may be 30~60 degrees, for example, 30 degrees, 45 degrees, 50 degrees, 60 degrees and etc. In other embodiments, the included angle α between the axial direction of the opening of the groove 111 and the vertical direction may be smaller than 30 degrees or greater than 60 degrees, for example, 29 degrees, 61 degrees and etc., which is not limited by the embodiment.

Further, by regulating the shape of the opening of the groove 111, for example, the axial direction of the opening and etc., and controlling the added amount of the inhibitor as well, the shape of the gap 410 formed between the silicon crystal 400 and the bit line structure 200 can be regulated. On this basis, as shown in FIG. 6 to FIG. 9, in this embodiment, a height of the gap 410 may be greater than or equal to a height of a metal layer 210 (for example, tungsten, W) in the bit line structure 200.

It is to be noted that as shown in FIG. 6 to FIG. 9, the three growth stages in the growth process of the silicon crystal 400 in this embodiment may respectively correspond to the three growth stages in the growth process of the silicon crystal 400 in the first embodiment. On this basis, the process design about different added amounts of the inhibitor in the three growth stages in this embodiment may also respectively correspond to the process design about different doping concentrations of the doping source in the three growth stages in the first embodiment. In other words, in the embodiment, a change trend of the added amount of the inhibitor may be positively correlated with the change trend of the doping concentration of the doping source. However, in the whole growth process of the silicon crystal 400, a change point of the added amount of the inhibitor is not limited to superposition with the change point of the doping concentration of the doping source completely.

It is to be understood that in each embodiment in accordance with the design concept of the storage node contact structure provided by the disclosure, the growth process of the silicon crystal 400 may include growth stages of other quantities and also may be an integrated process course. In any case, the change design of the doping concentration of the doping source is not affected by the change design of the added amount of the inhibitor and the added amount of the inhibitor also may be changeless.

The Third Embodiment of a Method for Forming a Storage Node Contact Structure

Figure 11:
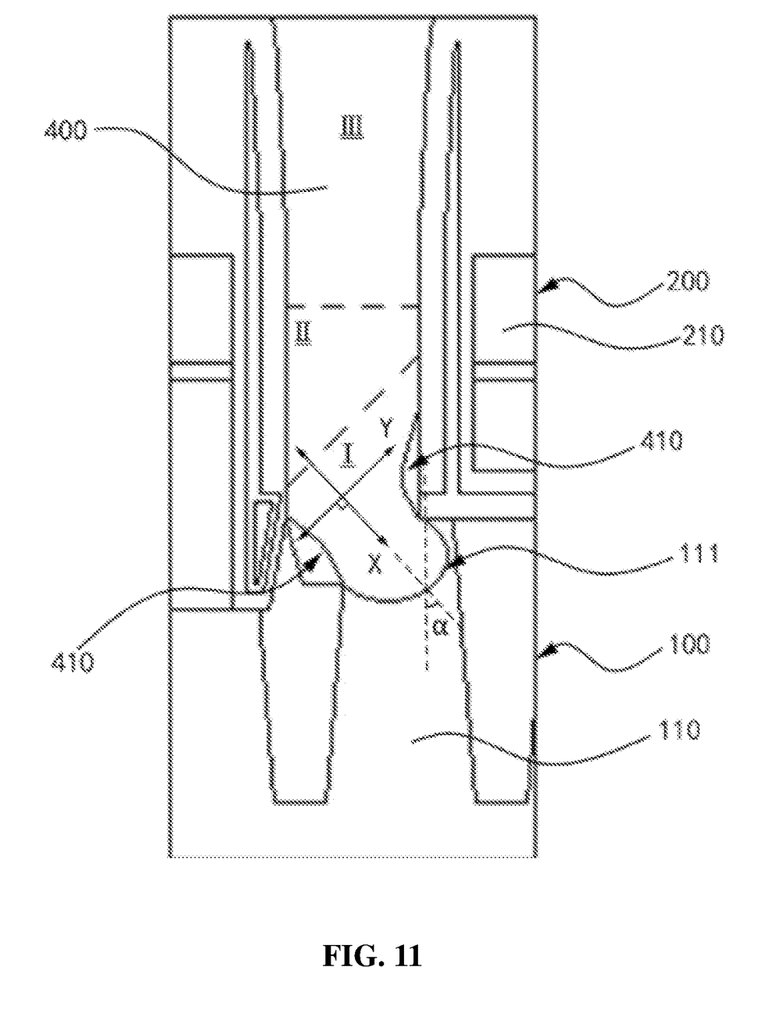
FIG. 11 is a structural schematic diagram of a semiconductor structure in an operation of a method for forming a storage node contact structure according to yet another exemplary embodiment.

Based on detailed description of two exemplary embodiments of the method for forming a storage node contact structure provided by the disclosure, another exemplary embodiment of a method for forming a storage node contact structure provided by the disclosure is described in combination with FIG. 11.

Referring to FIG. 11, it representatively illustrates a structural schematic diagram of a semiconductor structure in an operation of a method for forming a storage node contact structure provided by the disclosure. The method for forming a storage node contact structure provided by the disclosure in this exemplary embodiment is substantially same as that in the second embodiment in the process design. Primary difference between this embodiment and the second embodiment is described below.

As shown in FIG. 11, in this embodiment, the included angle α between the axial direction (that is, the first direction) of the opening of the groove 111 and the vertical direction is larger than the included angle α in the second embodiment. On this basis, the height of the gaps 410 formed by the silicon crystal 400 initially growing in the groove 111 is smaller than the height of the gaps 410 in the second embodiment. Accordingly, by regulating the shape of an opening of the groove 111, for example, the axial direction of the opening and etc., the shape of the gaps 410 formed between the silicon crystal 400 and the bit line structure 200 can be regulated.

Figure 5:
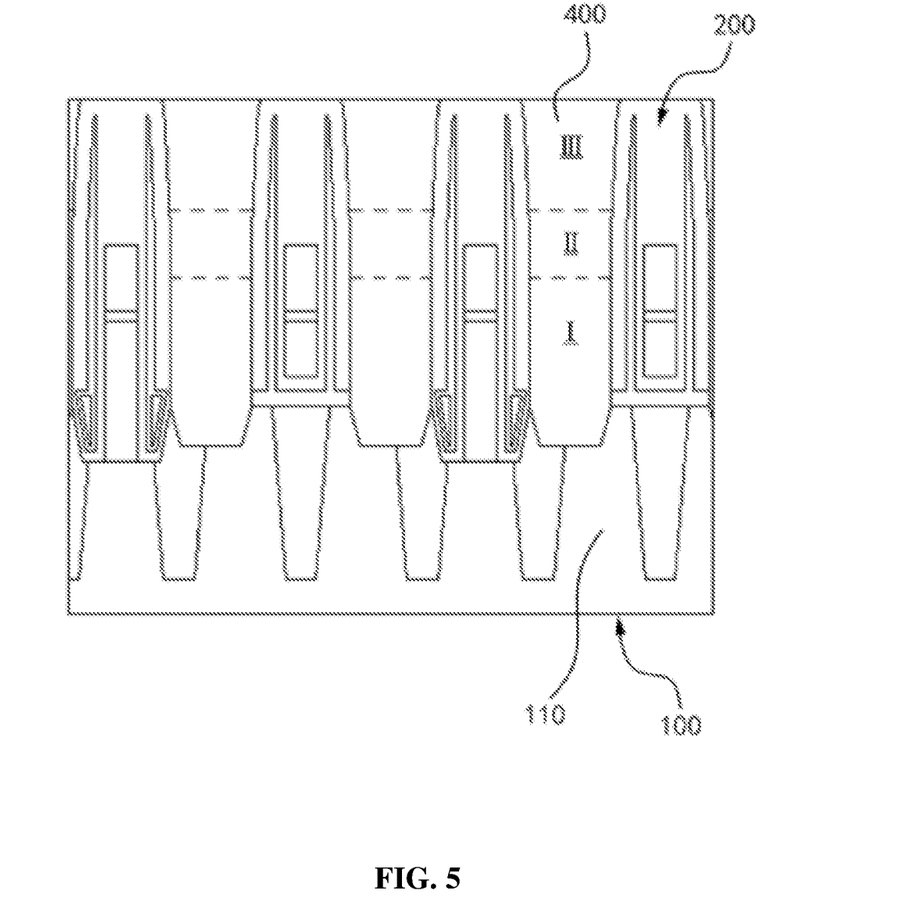
FIG. 5 is a structural schematic diagram of a semiconductor structure processed by a method for forming a storage node contact structure shown in FIG. 1 to FIG. 4.
Figure 10:
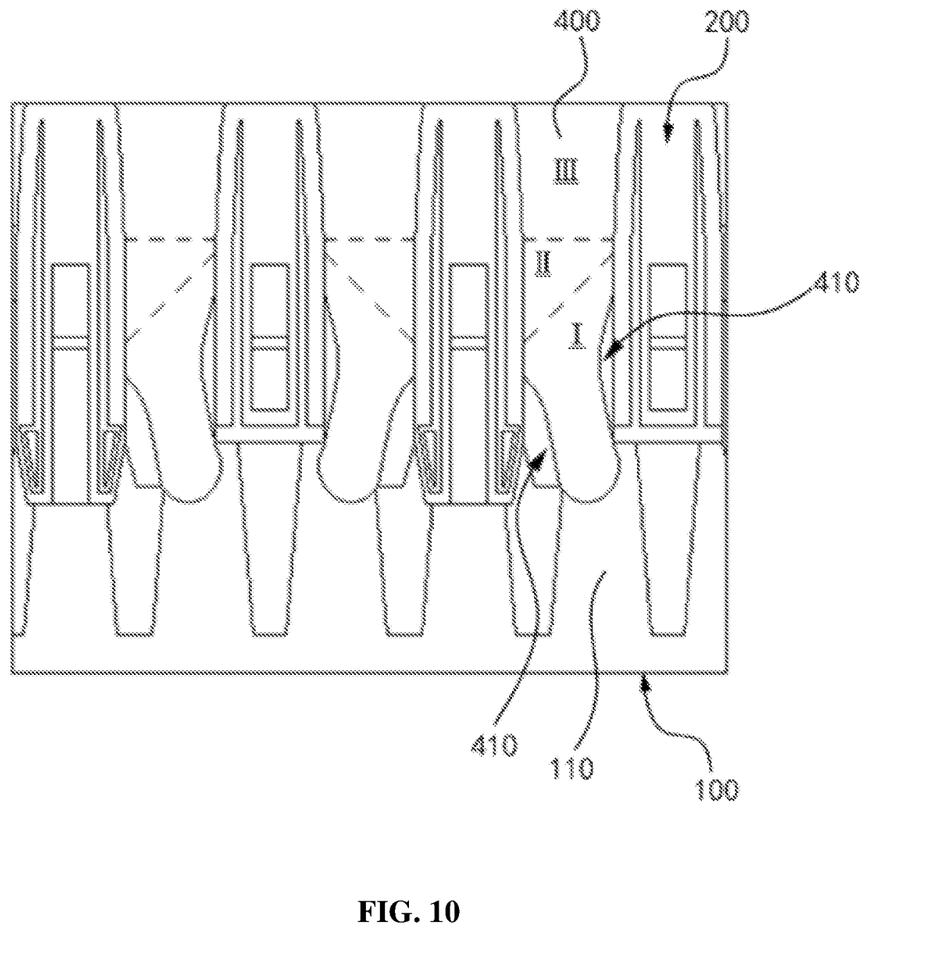
FIG. 10 is a structural schematic diagram of a semiconductor structure processed by a method for forming a storage node contact structure shown in FIG. 6 to FIG. 9.

Based on above detailed description of several exemplary embodiments of a method for forming a storage node contact structure provided by the disclosure, an exemplary embodiment of a semiconductor structure provided by the disclosure is described in combination with FIG. 5 or FIG. 10.

As shown in FIG. 5 or FIG. 10, in this embodiment, the semiconductor structure provided by the disclosure includes a substrate 100, bit line structures 200 formed on a surface of the substrate 100 and contact holes 300 formed between the bit line structures 200, and silicon crystal gradual change structures formed in the contact holes 300, in which silicon crystal changes from monocrystalline silicon to heavily doped polycrystalline silicon. By means of the design, the disclosure may improve the processing efficiency of the contact and lower the production cost while meeting the requirement on resistance of the contact structure of the active area 10 and reducing the resistance of the storage node contact structure.

Optionally, in the embodiment, the silicon crystal gradual change structure may be used as a storage node contact structure.

Optionally, in the embodiment, the silicon crystal gradual change structure may include a first region I, a second region II and a third region III. Specifically, the first region I may be monocrystalline silicon, the second region II may be a transition region from monocrystalline silicon to polycrystalline silicon, and the third region III may be polycrystalline silicon (for example, heavily doped polycrystalline silicon). On this basis, the doping concentration in the first region I may be $7E+20/cm^3 \sim 8E+20/cm^3$. The doping concentration in the second region II may be $8.5E+20/cm^3 \sim 9.5E+20/cm^3$. The doping concentration in the third region III may be $1E+21/cm^3 \sim 1.1E+21/cm^3$.

In a word, a doping source is added in the growth process of the silicon crystal and the doping concentration of the doping source when the growth is over is controlled to be less than the doping concentration of the doping source when the growth is started so as to form silicon crystal gradual change structures in which the silicon crystal changes from monocrystalline silicon to heavily doped polycrystalline silicon in the contact holes. By means of the design, the disclosure may improve the processing efficiency of the contact and lower the production cost while reducing the resistance of the storage node contact structure.

Although the disclosure has been described with reference to several typical embodiments, it should be understood that the terms used are illustrative and exemplary terms rather than restrictive terms. As the disclosure can be implemented specifically in various forms without departing from spirit or essence of the disclosure, it should be understood that the embodiments are not limited to any of above-mentioned details but should be explained extensively in the spirit and scope of the attached claims, and therefore, all variations and modifications falling within the claims or equivalent ranges thereof should be covered by the attached claims.

The invention claimed is:

1. A method for forming a storage node contact structure, comprising:
    providing a substrate, bit line structures being formed on a surface of the substrate and contact holes being formed between the bit line structures; and
    forming silicon crystal gradual change structures in the contact holes by a growth process, wherein the growth process comprises an epitaxial growth process, a doping source and an inhibitor are introduced in the epitaxial growth process, a doping concentration of the doping source when the epitaxial growth process is over is greater than the doping concentration of the doping source when the epitaxial growth process is started, an added amount of the inhibitor is decreased from the epitaxial growth process start to over, and the silicon crystal gradual change structures comprise silicon crystal that is graded from monocrystalline silicon at a bottom of each of the contact holes to heavily doped polycrystalline silicon at a top of each of the contact holes.

2. The method for forming the storage node contact structure according to claim 1, wherein the epitaxial growth process of the silicon crystal gradual change structures comprises a plurality of growth stages, and the doping concentration of the doping source in the plurality of growth stages is increased gradually.

3. The method for forming the storage node contact structure according to claim 2, wherein the doping concentration of the doping source in any one growth stage is constant.

4. The method for forming the storage node contact structure according to claim 3, wherein
    the plurality of growth stages sequentially comprises a first growth stage, a second growth stage and a third growth stage,
    the doping concentration of the doping source in the first growth stage is constant and is a first concentration,
    the doping concentration of the doping source in the second growth stage is constant and is a second concentration;
    the doping concentration of the doping source in the third growth stage is constant and is a third concentration; and
    the first concentration is smaller than the second concentration, and the second concentration is smaller than the third concentration.

5. The method for forming the storage node contact structure according to claim 4, wherein
    the doping source comprises phosphorus,
    the first concentration is $7E+20/cm^3 - 8E+20/cm^3$,
    the second concentration is $8.5E+20/cm^3 - 9.5E+20/cm^3$, and
    the third concentration is $1E+21/cm^3 - 1.1E+21/cm^3$.

6. The method for forming the storage node contact structure according to claim 5, wherein the first concentration is 7.5E+20/cm$^3$.

7. The method for forming the storage node contact structure according to claim 5, wherein the second concentration is 9E+20/cm$^3$.

8. The method for forming the storage node contact structure according to claim 5, wherein the third concentration is 1.05E+21/cm$^3$.

9. The method for forming the storage node contact structure according to claim 1, wherein the doping concentration of the doping source in the epitaxial growth process is increased gradually.

10. The method for forming the storage node contact structure according to claim 1, wherein
   before growing the silicon crystal gradual change structures, a groove corresponding to an active area is formed in a portion at the bottom of each of the contact holes, wherein there is an included angle that is greater than 0 degree but smaller than 90 degrees between an axial direction of an opening of the groove and a vertical direction;
   when the growth of the silicon crystal gradual change structures is started, the silicon crystal grows starting from a bottom of the groove in the active area, and a growth rate of the silicon crystal gradual change structures along a first direction and a growth rate of the silicon crystal gradual change structures along a second direction are controlled in the epitaxial growth process, such that the growth rate of the silicon crystal gradual change structures along the first direction is greater than the growth rate of the silicon crystal gradual change structures along the second direction, and
   when the growth of the silicon crystal gradual change structures is over, the growth rate of the silicon crystal gradual change structures along the first direction is equal to the growth rate of the silicon crystal gradual change structures along the second direction, so as to form gaps, each gap is respectively formed between an adjacent one of the silicon crystal gradual change structures and a corresponding one of the bit line structures, the bit line structures are located at two sides of the groove in the active area along the second direction; and wherein
   the first direction is the axial direction of the opening of the groove in the active area and the second direction is perpendicular to the first direction in a vertical plane.

11. The method for forming the storage node contact structure according to claim 10, wherein
   in the epitaxial growth process of the silicon crystal gradual change structures, the growth rate of the silicon crystal gradual change structures along the first direction and the growth rate of the silicon crystal gradual change structures along the second direction are controlled by adding the inhibitor and controlling the amount of the inhibitor, and
   the added amount of the inhibitor is negatively related to an epitaxial growth nucleation rate of the silicon crystal gradual change structure; and wherein
   the added amount of the inhibitor when the epitaxial growth process is over is smaller than the added amount of the inhibitor when the epitaxial growth process is started.

12. The method for forming the storage node contact structure according to claim 11, wherein the added amount of the inhibitor when the epitaxial growth process is over is 0.

13. The method for forming the storage node contact structure according to claim 11, wherein the epitaxial growth process of the silicon crystal gradual change structures comprises a plurality of growth stages, and the added amount of the inhibitor in the plurality of growth stages is decreased gradually.

14. The method for forming the storage node contact structure according to claim 13, wherein
   the plurality of growth stages sequentially comprises a first growth stage, a second growth stage and a third growth stage,
   the added amount of the inhibitor in the first growth stage is constant and is a first amount,
   the added amount of the inhibitor in the second growth stage is an amount range in which the added amount is decreased gradually, and
   the added amount of the inhibitor in the third growth stage is constant and is a third amount; and wherein
   the first amount is greater than or equal to an upper limit of the amount range, and a lower limit of the amount range is greater than or equal to the third amount.

15. The method for forming the storage node contact structure according to claim 14, wherein
   the inhibitor comprises hydrochloric acid and the added amount of the inhibitor is represented by a flow rate of the hydrochloric acid; and wherein
   the first amount is 175 sccm-185 sccm, the upper limit of the amount range is 130 sccm-140 sccm, the lower limit of the amount range is 85 sccm-95 sccm, and the third amount is 40 sccm-50 sccm.

16. The method for forming the storage node contact structure according to claim 15, wherein the first amount is 180 sccm; the upper limit of the amount range is 135 sccm and the lower limit of the amount range is 90 sccm; and the third amount is 45 sccm.

* * * * *